(12) United States Patent
Rodriguez Sessarego et al.

(10) Patent No.: US 11,763,047 B2
(45) Date of Patent: Sep. 19, 2023

(54) METHOD FOR PARALLELIZED SIMULATION OF THE MOVEMENT OF A MACHINE COMPONENT IN OR NEAR A WORK OBJECT

(71) Applicant: Stefan Becker, Munich (DE)

(72) Inventors: Ivan Diego Rodriguez Sessarego, Garching bei München (DE); Stefan Becker, Munich (DE)

(*) Notice: Subject to any disclaimer, the term of this patent is extended or adjusted under 35 U.S.C. 154(b) by 629 days.

(21) Appl. No.: 16/566,285

(22) Filed: Sep. 10, 2019

(65) Prior Publication Data

US 2020/0082042 A1 Mar. 12, 2020

(30) Foreign Application Priority Data

Sep. 10, 2018 (EP) .................................. 18193480

(51) Int. Cl.
*G06F 30/20* (2020.01)
*G05B 19/19* (2006.01)

(52) U.S. Cl.
CPC .............. *G06F 30/20* (2020.01); *G05B 19/19* (2013.01); *G05B 2219/40519* (2013.01); *G05B 2219/45145* (2013.01)

(58) Field of Classification Search
CPC ................... G06F 30/20; G05B 19/19; G05B 2219/40519
USPC ........................................................... 703/7
See application file for complete search history.

(56) References Cited

U.S. PATENT DOCUMENTS

| | | | |
|---|---|---|---|
| 9,754,405 B1* | 9/2017 | Young ................... | G06T 17/005 |
| 2005/0285858 A1* | 12/2005 | Yang ....................... | G06T 15/08 345/420 |
| 2014/0200706 A1 | 7/2014 | Pruschek et al. | |
| 2015/0294500 A1* | 10/2015 | Tucker .................... | G06T 17/00 700/160 |

OTHER PUBLICATIONS

Konobrytski_2013 (Automated CNC Tool Path Planning and Machining Simulation on Highly Parallel Computing Architects, Clemson University, 2013) (Year: 2013).*
European Search Report, European Patent Application No. 18193480.3 dated May 23, 2019 (2 pages).

* cited by examiner

*Primary Examiner* — Brian S Cook
(74) *Attorney, Agent, or Firm* — Wiggin and Dana LLP

(57) ABSTRACT

The present invention relates to a method for parallelized simulation of the movement of a machine component in or near a work object, wherein: a planned trajectory of the machine component is divided into several trajectory portions; a simulation of at least a first trajectory portion and a second trajectory portion is performed at least partly in parallel yielding simulation results, wherein the simulation comprises determining incidents, preferably collisions, along the trajectory portions; at least the simulation results of the first trajectory portion and the second trajectory portion are merged yielding a merged simulation result; and the merged simulation result is outputted.

17 Claims, 3 Drawing Sheets

METHOD FOR PARALLELIZED SIMULATION OF THE MOVEMENT OF A MACHINE COMPONENT IN OR NEAR A WORK OBJECT

FIELD OF THE INVENTION

The present invention relates to a method for parallelized simulation of the movement of a machine component in or near a work object.

BACKGROUND

In complex industrial milling or machining processes, a movement of a machine component (e.g. a milling head with a milling tool) can be simulated before the start of the actual milling or machining process. Due to the simulation it is then possible to identify possible collisions or other incidents that might occur during the process.

However, especially when working on large or complicated work objects (e.g. a motor block with a multitude of cavities), the simulation of the movements can take up to several hours, since thousands or millions of movement of the machine component have to be calculated. Also, such simulations are usually performed sequentially, which also is time-consuming.

SUMMARY OF THE INVENTION

It is therefore the object of the present invention to provide a method for simulating the movement of a machine component which reduces the necessary simulation time.

This object is solved by a method in accordance with claim 1.

The invention relates to a method for parallelized simulation of a movement of a machine component in or near a work object, wherein:
  (a) a planned trajectory of the machine component is divided into several trajectory portions;
  (b) a simulation of at least a first trajectory portion and a second trajectory portion is performed at least partly in parallel yielding simulation results, wherein the simulation comprises determining incidents, preferably collisions, along the trajectory portions;
  (c) at least the simulation results of the first trajectory portion and the second trajectory portion are merged yielding a merged simulation result, wherein merging comprises that the simulation results of the first trajectory portion and the second trajectory portion are combined and incidents determined along the second trajectory portion are reassessed based on the simulation results of the first trajectory portion, wherein an incident is removed from or not taken over into the merged simulation results if the reassessment indicates that the incident cannot occur; and
  (d) the merged simulation result preferably is then outputted.

The invention is based on the finding that a parallelized simulation of the movement of a machine component in or near a work object is possible if the parallelized simulation is directed to different trajectory portions along which the machine component will be moved subsequently. It may then happen that e.g. during the simulation of the second trajectory portion an incident or collision is determined, wherein the machine component e.g. collides with material of the work object. During the merging of the simulation results of the first and second trajectory portion, it can then be determined that the collision within the second trajectory portion cannot occur since the material of the work object that the machine component collided with, had previously been removed by the machine component when following the first trajectory portion. Consequently, the collision (i.e. the incident) is then removed from or not taken over into the merged simulation results, thereby yielding correct merged simulation results.

To put it short, the invention allows a parallelized simulation by first dividing the simulation into several parts (i.e. the trajectory portions) wherein the simulation of the portions is then performed regardless of prior movements of machine component. Since these prior movements of the machine component are at first not taken into consideration, more incidents than actually present may be determined during the simulation (of e.g. the first and second trajectory portion). Actually nonexistent incidence are then removed from or not taken over into the merged simulation results. Thereby, a parallelized simulation is enabled, which allows to drastically reduce the time required for the simulation. For example, the simulation time can be reduced to minutes or even less.

In the following the method will be described in even more detail.

When e.g. looking at a milling process, the machine component (e.g. a milling head with a milling tool) will move in or near the work object along a planned trajectory and will remove material from the work object. The same applies to cutting or drilling. The planned trajectory is divided into several trajectory portions, wherein the different trajectory portions may then be simulated in parallel. Particularly, the simulation of at least the first and second trajectory portion is performed at least partly or fully in parallel (i.e. at the same time). It is to be understood that of course a plurality (e.g. >100, >1000, >5000) different trajectory portions can be simulated at least partly or fully in parallel. The parallelization of the simulation can be performed e.g. on a plurality of processors or processor cores.

The simulation of the two trajectory portions preferably yields simulation results. The simulation results can indicate if an incident is present. An incident can occur e.g. by a collision of the machine component with the work object. Alternatively or additionally an incident could also be that the machine component is moved to fast, which would result e.g. in overheating of the milling tool/the machine component. Further alternatively, an incident could also comprise the removal or addition of material of the work object, e.g. by milling. During the merging, it could then be determined that no milling was possible since the material of the work object had already been removed in an earlier trajectory portion.

The simulation of all trajectory portions may be based on e.g. the original shape of the work object, i.e. the raw form of the work object. In other words, changes to the work object that occurred during earlier trajectory portions (e.g. the first trajectory portion) are first not taken into account. This can lead to the case that an incident is determined at later trajectory portions (e.g. the second trajectory portion) that cannot occur since e.g. the material of the work object has already been removed at the site of the incident during earlier trajectory portions. These non-existent incidents are determined when the simulation results of the trajectory portions are merged. Non-existent incidents (i.e. incidents that cannot occur) are therefore removed from or not taken over into the merged simulation results. Thereby, if it is e.g. determined within the second trajectory portion that the milling tool is moving too fast through the material of the work object and would therefore overheat, but it is then determined when merging the simulation results that no material will be present at the site where the milling tool is moved with higher speed, it can then be concluded that no overheating will occur and therefore no incident will occur.

For an easier simulation, the work object may also comprise parts of a machine that comprises the machine component, wherein it is possible that the machine component collides with those parts of the machine. Thereby, the method as described herein could also be used to compute potential collisions between different parts of the machine, e.g. between the milling tool and a palette carrying the work object.

Alternatively or additionally to the voxelization of parts of the machine (see below), the parts of the machine could also be triangulated. In order to identify a collision between a part of the machine and the work object, it may then be checked if one of the triangles of the machine intersects a voxel (see below) of the work object.

Finally, the merged simulation result may be outputted. The merged simulation result can then be used to command a real machine component, wherein the real machine component can then work in accordance with the (trajectory of the) merged simulation result.

It is to be understood that the method as described herein is preferably performed on an electronic computer or an electronic device.

For the simulation, the planned trajectory may be determined e.g. from a programming of an industrial machine. The planned trajectory may indicate the path along which the machine component is planned to be moved. In general, the planned trajectory may be any sequence that indicates processes that are performed one after another (in time), wherein the spatial position of the different processes is known. The planned trajectory may comprise a set of tool coordinates that are to be executed preferably one after another. The planned trajectory may be stored independent form the below mentioned voxels. The planned trajectory may also comprise a mixture of different processes, e.g. drilling, milling, cutting, bending, punching, stamping, etc.

Further embodiments are described hereinafter and are disclosed in the figures and in the dependent claims.

In accordance with some embodiments, the planned trajectory is divided into trajectory portions that follow one another in time. This means, that the first trajectory portion is planned to be executed earlier than e.g. the second trajectory portion, etc. Preferably, the different trajectory portions may have the same duration, i.e. may have at least roughly equal execution time. Further preferably, the trajectory portions are directly following one another. In other words, no gaps in the planned trajectory are generated when the planned trajectory is divided into the trajectory portions.

In some embodiments, merging of the simulation results (e.g. of the first trajectory portion and of the second trajectory portion) only takes place in a predefined space preferably surrounding the trajectory portions. Thereby a merging of the simulation result has not to be performed over the whole work object, which results in less computational effort. The simulation time can thus be further reduced. The predetermined space surrounding the trajectory portions can include the space that lies within a predetermined distance (e.g. 10 cm, 30 cm or 50 cm) from the planned trajectory. The predetermined space can be defined by the size of the machine component. The same applies to the merging of the merged simulation results, as described later.

In some embodiments, voxels that are influenced by the machine component are stored. When merging of the simulation results (e.g. of the first trajectory portion and of the second trajectory portion), only the influenced voxels may be compared and merged. Thereby, the influenced voxels can form the predetermined space.

The planned trajectory may be a curved line in 2D or 3D space. It is to be noted that the method as described herein, may be performed in three-dimensional (3D) or two-dimensional (2D) space.

In accordance with some embodiments, the space of the work object and/or the space of the planned trajectory is represented using voxels. Alternatively, for 2D-space, pixels can be used. The pixels/voxels are a discretization of the work object and/or the planned trajectory. Preferably, the work object is completely voxelized or discretized using pixels. The simulation can then store results for each of the pixels/voxels, as will described later.

It is noted that in the following reference is made to voxels. However, also pixels could be used. Furthermore, it is noted that, alternatively or additionally, a triangulation could be used to detect incidents and/or collisions. Triangulation can yield a higher precision than voxelization and could thus be used to check for collisions in a finishing process (e.g. of a milling process) where a more accurate description of the work-piece is required.

According to some embodiments, the space of the planned trajectory and the space within a predetermined distance from the planned trajectory are represented using smaller voxels than the remaining space. In other words, a 2-level voxelization is performed. Due to the smaller voxels (i.e. voxels comprising less space than other voxels) it is possible to perform a more detailed and/or better simulation along the planned trajectory and/or along surfaces of the work object. Other parts of the work object, which are further away from the planned trajectory can also be represented using (bigger) voxels (i.e. be voxelized). However, a 2-level voxelization allows to further reduce computing requirements and at the same time to yield very exact simulation results along the planned trajectory. In the same manner, at least a portion of the smaller voxels can be divided into even smaller voxels, thereby creating a multi-level voxelization.

According to some embodiments, each voxel is assigned to at least one state. Advantageously the state comprises information if the voxel contains material of the work object. For example, each voxel can be assigned the state "1" if the voxel is filled with material of the work object. If no material is present, then the state can be "0". For example, each voxel can be assigned to only one state at a time.

Additionally, the state of a voxel that is filled with material can be changed to a further state (e.g. "2") if an incident is present for the respective voxel. Advantageously, the state indicating an incident can only be assigned if the voxel contains material and therefore previously was in e.g. state "1".

Preferably, the simulation results of the respective trajectory portion comprise the states of the voxels after the movement of the machine component along the respective trajectory portion.

In accordance with some embodiments, the merged simulation result comprises a result value for each or at least some of the voxels. The result value is the state of the voxel after comparing the simulation results of the trajectory portions. For example, the simulation result of the second trajectory portion can indicate a collision for a certain voxel (state="2"). For the same voxel, the simulation of the first trajectory portion can have changed the state from "1" to "0", as the material present in said voxel may have been removed by the machine component along the first trajectory portion. When merging the simulation results, state "0" of the simulation results of the first trajectory portion is merged with state "2" of the simulation results of the second trajectory portion. The result value, i.e. the state of the respective voxel in the merged simulation results is then set to "0" as no material is present at that voxel and therefore no collision can occur.

It is to be understood that a voxel—of course—cannot comprise real material of the work object. Rather, the voxel represents a part in space that could in reality be filled or not filled with material of the work object.

According to some embodiments, an incident is a collision of the machine component with the work object. To be able to determine an incident, e.g. the spatial orientation and/or a size of the machine component is known. Also, a maximum speed during a milling or machining process can be known. Particularly, the planned trajectory can comprise the information about the respective spatial orientation at different points along the planned trajectory.

According to some embodiments, in case a collision is determined, then a spatial orientation of the machine component is modified in order to avoid the collision. For example, the spatial orientation can be modified such that the planned trajectory is maintained, i.e. the tip of the milling tool may stay in the same position but milling is performed from a different direction. This may be possible if e.g. the milling tool is round or spherical. The modification of the spatial orientation can be performed randomly until a non-collision orientation is found. The respective trajectory portion or only a part of the respective trajectory portion which is adjacent the collision site, can then be simulated again with the new spatial orientation. If no spatial orientation without a collision can be found, simulation is continued, preferably using the original spatial orientation.

The determination or detection of modifications refers to the simulation. As described herein, the simulation can then be executed based on the modified trajectory on a real industrial machine.

In accordance with some embodiments, a first merged simulation result and a second merged simulation result are merged to create a new merged simulation result, wherein:
  (a) merging comprises that the first merged simulation result and the second merged simulation result are combined and incidents stored in the second merged simulation results are reassessed based on the first merged simulation results, wherein the incident is removed or not taken over into the new merged simulation results if the reassessment indicates that the incident cannot occur; and
  (b) the new merged simulation result is preferably outputted.

When merging the simulation results, differences between the simulation results of the different trajectory portions are also processed. For example, if the simulation result indicates that material has been removed from the work object, this will be reflected in the merged simulation results.

The first merged simulation result may be based on a simulation of a first and second trajectory portion, whereas the second merged simulation result may be based on a simulation of a third and fourth trajectory portion.

In general, when merging the simulation results of the trajectory portions, the corresponding voxels that are identical in the simulation results of the different trajectory portions are taken over into the simulation results without amendments. However, if the state of the corresponding voxels after the simulation of the different trajectory portions is different, then these differences have to be processed. For example, if material is removed along one trajectory portion, then the state in the merged simulation results for the respective voxel will be set to no material ("0").

Generally, the method may comprise one step of simulation of the different trajectory portions in parallel followed by multiple steps of merging two simulation results to a merged simulation result until only one final simulation result is outputted. The merging of the simulation results can also be performed at least partly in parallel.

For example, the planned trajectory can be divided into N trajectory portions. All N trajectory portions can then be simulated in parallel, yielding N simulation results. Then, in a first round of merging the simulation results of trajectory portions 1 and 2, 3 and 4, . . . , N−1 and N can be merged. Thereby, N/2 merged simulation results are yielded. The merging can be performed in parallel. Then again the N/2 merging results can again be merged, wherein preferably "neighbouring" merged simulation results are merged to new merged simulation results (N/4). This process is repeated until only one final simulation result is present.

In accordance with some embodiments, the simulation of the first trajectory portion and the second trajectory portion is performed on at least two different CPUs (central processing units) and/or GPUs (graphic processing units) and/or is performed on different processor cores. Preferably, more than 10 or more than 100 different CPUs and/or GPUs and/or processor cores are used. The more processors/cores are used, the faster the simulation will run.

GPUs are particularly suitable for collision detection and therefore allow an efficient and fast simulation of the trajectory portions. GPUs can comprise a plurality of processor cores (more than 100 or more than 1000 processor cores). Thus, it is possible to perform e.g. more than 100 or more than 1000 simulations of different trajectory portions on separate GPU processor cores in parallel. This provides a high efficiency in terms of computing time and energy consumption.

Alternatively, it is also possible to provide a parallel processing in an FPGA (field programmable gate array) using separate processing units of the FPGA. Furthermore, also ASICs (application specific integrated circuits) can be used in a similar manner.

Particularly, in the merging process, corresponding voxels of the simulation results of the first and second trajectory portion have to be compared. For the comparison of the two voxels, no information about other voxels is necessary. Therefore, the merging process can be easily performed in parallel. For example, the simulation results of the trajectory portions can be divided into two or more parts such that at least some of or all of the processors/processors cores initially used for the simulation can contribute to the merging process.

In accordance with some embodiments, the machine component is a milling head comprising a milling tool. The milling tool can be rotating with respect to the milling head. Due to the rotation of the milling tool, material of the work object can be removed.

The machine component could also be a movable part of an Electric Discharge Machine (EDM) or any other material-removing machine.

Alternatively or additionally, the machine component can also comprise a substance adding tool, e.g. a printer head of a 3D printer. The method described herein can also be used for additive production processes, not only for subtractive production processes (like milling). Similar to subtractive processes, in additive production processes, the simulation results for "later" trajectory portions can be corrected by the simulation results of "earlier" trajectory portions. For example, the simulation result of a second trajectory portion may indicate that no collision is present at a specific voxel. This can be corrected during the merging process when the simulation of the first trajectory portion indicates that material has been added during the first trajectory portion at a point where the machine component later is present during the second trajectory portion.

In accordance with some embodiments, prior to the start of the simulation of the first trajectory portion and the second trajectory portion, dimensions of the work object and/or the machine component are measured. The dimensions of the work object and/or the machine component are measured at the real-world work object and/or the real-world machine component. The measurement can e.g. be performed using a 3D scanner, particularly a laser scanner or a stereo camera. The measurement data can then be inputted into the simulation. In other words, the simulation can be based on the measured dimensions.

In accordance with some embodiments, the merged simulation result is outputted to an industrial machine, wherein the industrial machine performs work on the work object in accordance with the simulation results. It is to be understood that also the new merged simulation results may be outputted to the industrial machine. The results may only be outputted if no incidents/collisions are determined or if incidents/collisions are avoided by a modified planned trajectory. The simulation therefore can assure that no collision will happen during the real processing of the work object.

The invention further relates to an industrial machine, preferably a milling machine or a 3D printer, wherein the industrial machine is adapted to execute the method as described herein. Particularly, the industrial machine is adapted to:
(a) divide a planned trajectory of a machine component of the industrial machine into several trajectory portions;
(b) perform a simulation of at least a first trajectory portion and a second trajectory portion at least partly in parallel yielding simulation results, wherein the simulation comprises determining incidents, preferably collisions, along the trajectory portions; and
(c) merge at least the simulation results of the first trajectory portion and the second trajectory portion yielding a merged simulation result, wherein merging comprises that the simulation results of the first trajectory portion and the second trajectory portion are combined and incidents determined along the second trajectory portion are reassessed based on the simulation results of the first trajectory portion, wherein the incident is removed or not taken over into the merged simulation results if the reassessment indicates that the incident cannot occur.

The industrial machine can be further adapted to use the merged simulation result to process the work object.

The disclosure comprised herein which relates to the inventive method correspondingly also relates to the inventive industrial machine.

BRIEF DESCRIPTION OF THE DRAWINGS

The invention will be explained in the following in detail by means of exemplary embodiments and with reference to the figures.

DETAILED DESCRIPTION OF THE INVENTION

Figure 1:
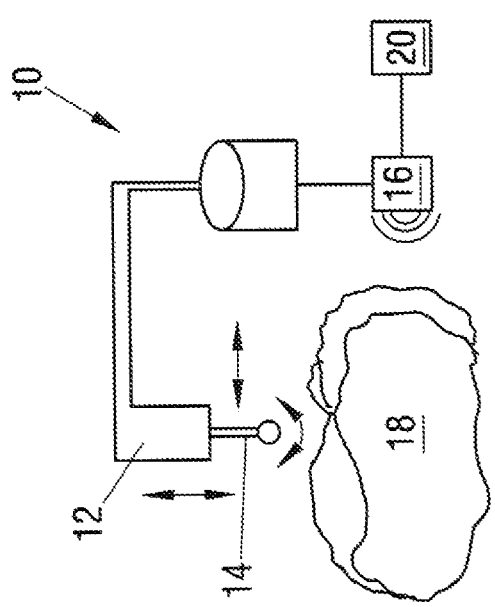
FIG. 1 shows a schematic view of an industrial machine and a work object.

FIG. 1 shows an industrial machine, namely a milling machine 10. The milling machine 10 comprises a milling head 12 having a milling tool 14. The milling head 12 and the milling tool 14 can be considered as a machine component. The milling head 12 can be moved in 3D-space, which results in a corresponding movement of the milling tool 14.

The milling machine 10 comprises a laser scanner 16 which measures the dimensions of a work object 18. The laser scanner 16 also measures the dimensions of the milling head 12 and the milling tool 14. Alternatively, these dimensions may be known.

The milling machine 10 further comprises a control unit 20 having a GPU with a plurality of processor cores (not shown).

The control unit 20 is adapted to execute the method as described herein.

Figure 2:
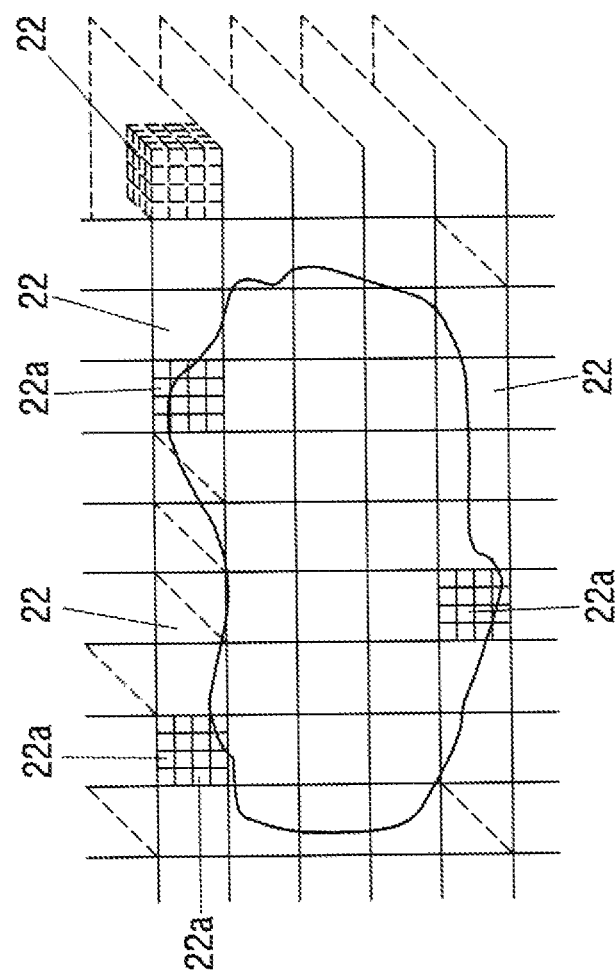
FIG. 2 shows a voxelization of the work object.
Figure 3:
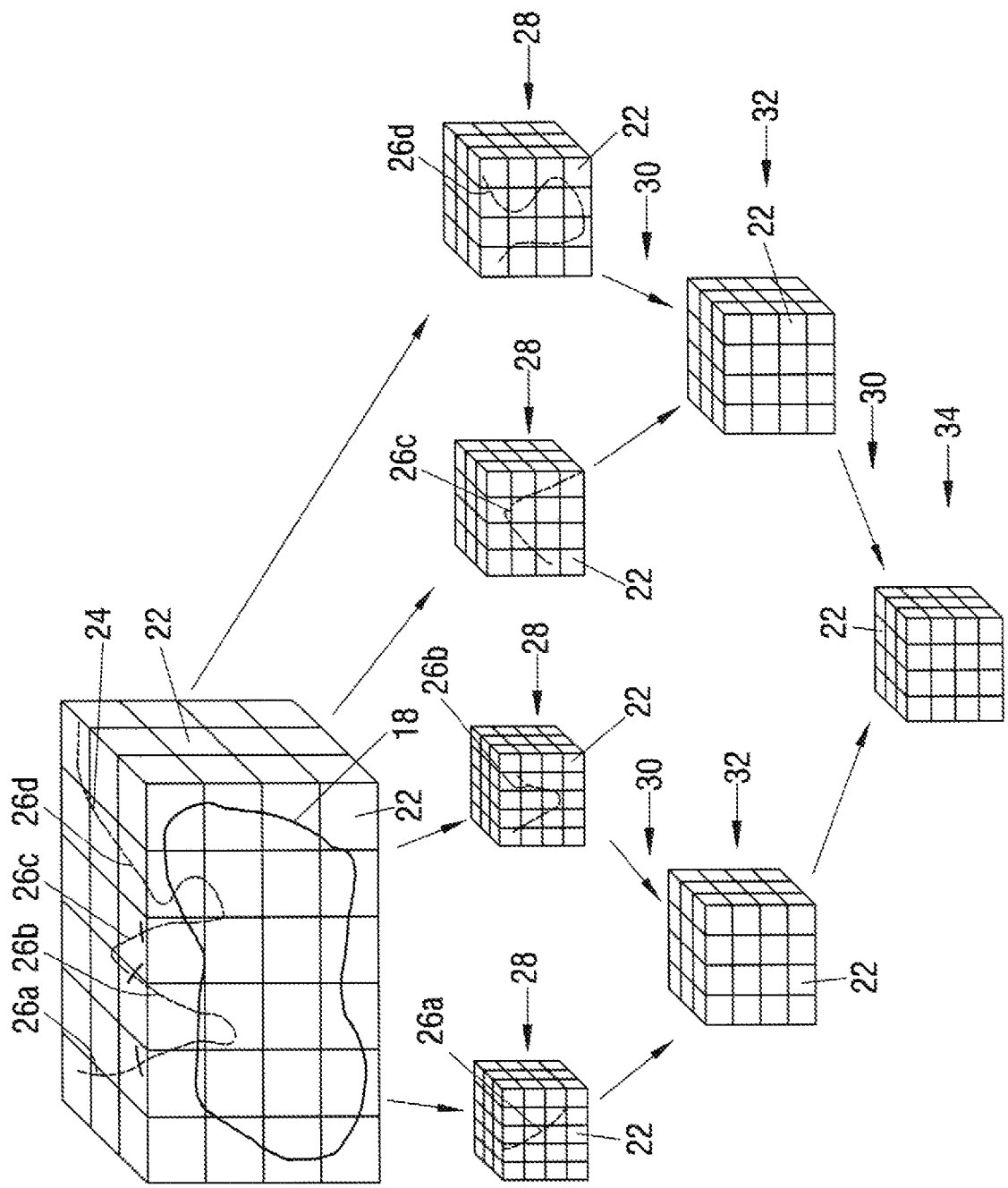
FIG. 3 schematically shows a simulation process.
Figure 4:
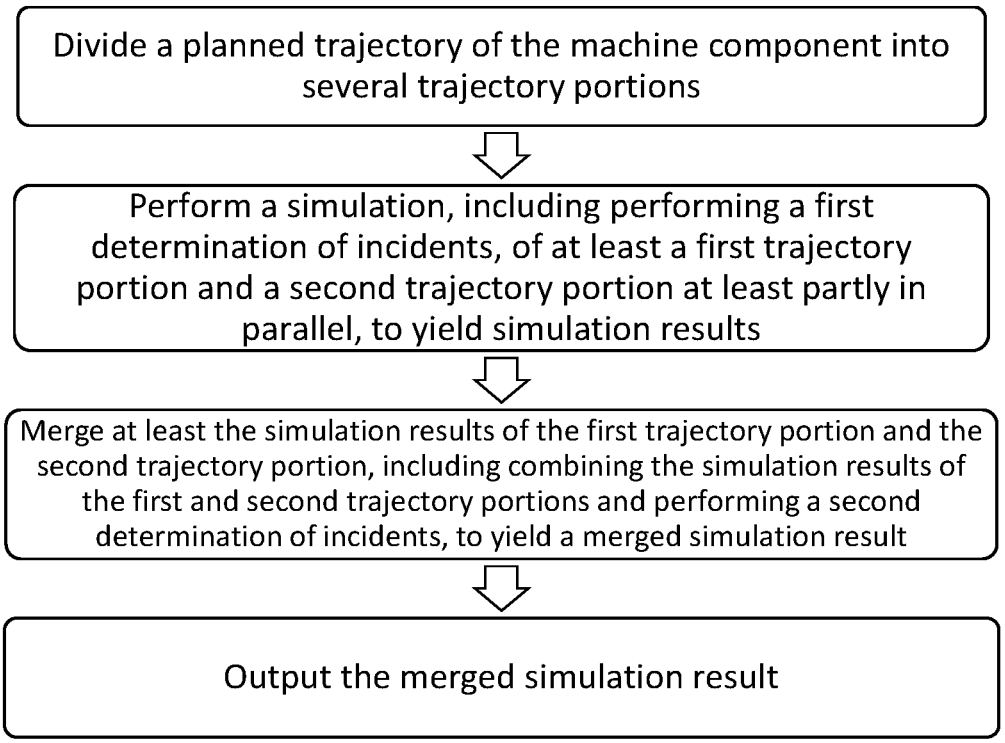
FIG. 4 is a flowchart of an embodiment of method for parallelized simulation of the movement of a machine component in or near a work object in accordance with the disclosure.
Figure 5:
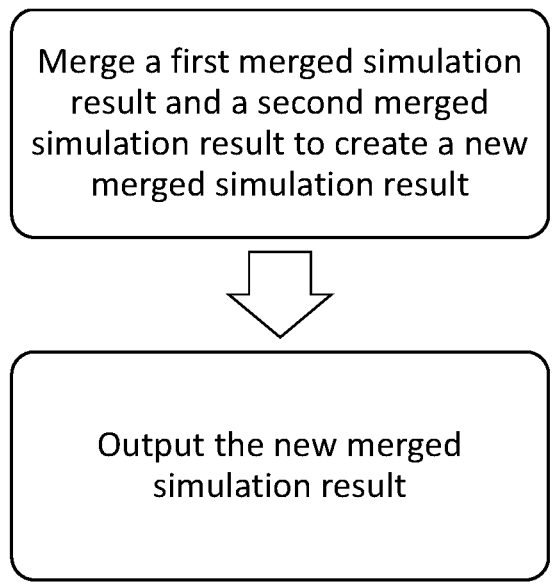
FIG. 5 is a flowchart of another embodiment of method for parallelized simulation of the movement of a machine component in or near a work object in accordance with the disclosure.

Firstly, based on the measurement data of the work object 18, a voxelization of the work object 18 is performed, as is shown in FIG. 2. During the voxelization the work object 18 is divided into cubic spaces, i.e. voxels 22. It is noted that in FIG. 2 the 3D character of the voxels is only slightly indicated for a better overview. During the voxelization some smaller voxels 22a are created along a trajectory (FIG. 3). The smaller voxels 22a allow for a better spatial resolution and thus a more accurate simulation result.

After the voxelization is performed, the control unit 20 starts a simulation, as is shown in FIG. 3. For the simulation a planned trajectory 24 is determined e.g. from a programming of the milling machine 10. The planned trajectory 24 indicates the path along which the end of the milling tool 14 is planned to be moved. The planned trajectory 24 is then divided into a first, second, third and fourth trajectory portion 26a, 26b, 26c, 26d. For each of the trajectory portions 26, a separate simulation 28 is performed on a different processor core of the GPU. During the simulation 28 it is determined if an incident, e.g. a collision or an overheating of the milling head 12 or the milling tool 14 will occur. Thereby, for each simulation 28, simulation results are produced. In a merging step 30 the simulation results are merged into a merged simulation result 32, wherein it is determined for each voxel 22 if an incident is present. If an incident is present, the incident is reassessed based on the corresponding simulation results of an earlier trajectory portion (e.g. simulation results for trajectory portion 26b are reassessed based on the simulation results of trajectory portion 26a). The incident is then removed or not even taken over into the merged simulation result 32, if the reassessment indicates that the incident cannot occur.

The merged simulation results 32 are then merged in a further merging step 30 into a final simulation result 34. If the final simulation result 34 does not show any incidents/collisions, the planned trajectory can be used to work on the real work object 18 using the real milling head 12 and the real milling tool 14. The real work can be controlled by control unit 20. If incidents persist, the planned trajectory 24 can be modified and the simulation can be repeated.

Due to the parallelization of the simulation of the different trajectory portions 26 (based on different GPU cores) it is possible to dramatically reduce the time required for the simulation of the whole planned trajectory 24. Therefore, the throughput of the milling machine 10 can be increased.

LIST OF REFERENCE NUMERALS 10 milling machine
12 milling head
14 milling tool
16 laser scanner
18 work object
20 control unit
22, 22a voxel
24 planned trajectory
26a-d trajectory portion
28 simulation
30 merging step
32 merged simulation result
34 final simulation result

What is claimed is:

1. A method for parallelized simulation of the movement of a machine component in or near a work object, comprising:
dividing a planned trajectory of the machine component into several time-sequential trajectory portions;
performing a simulation of each trajectory portion at least partly in parallel regardless of prior movements of the machine component occurring during an earlier trajectory portion, yielding simulation results, wherein the simulation comprises performing a first determination of suspected incidents along the trajectory portions, wherein each said suspected incident is a collision of the machine component with the work object;
merging at least the simulation results of a first trajectory portion and a later in time second trajectory portion yielding a merged simulation result, wherein the merging comprises combining the simulation results of the first trajectory portion and the second trajectory portion, and performing a second determination of suspected incidents including reassessing, suspected incidents determined along the later in time second trajectory portion based on the simulation results of the first trajectory portion, wherein the incident is removed from or not taken over into the merged simulation results if the reassessment indicates that the incident cannot occur;
merging a first merged simulation result and a second merged simulation result to create a new merged simulation result, wherein merging comprises combining the first merged simulation result and the second merged simulation result, reassessing incidents stored in the second merged simulation result based on the first merged simulation result, and removing the incident from, or not taking the incident over into the new merged simulation results if the reassessment indicates that the incident cannot occur; and
outputting the new merged simulation result.

2. The method of claim 1, wherein the determined incidents are collisions along the trajectory portions.

3. The method of claim 1, wherein the planned trajectory is divided into trajectory portions that follow one another in time.

4. The method of claim 1, wherein the merging of the simulation results only takes place in a predefined space surrounding the trajectory portions.

5. The method of claim 1, wherein the space of at least one of the work object and the planned trajectory is represented using voxels.

6. The method of claim 5, wherein the space of the planned trajectory and the space within a predetermined distance from the planned trajectory is represented using smaller voxels than the remaining space.

7. The method of claim 5, wherein each voxel is assigned to at least one state, based on the absence or presence of material of the work object or of an incident for said voxel, wherein the state comprises information if the voxel contains material of the work object.

8. The method of claim 5, wherein the merged simulation result comprises a result value for each or at least some of the voxels.

9. The method of claim 8, wherein the result value is the state of a respective voxel after comparing the simulation results of the first and second trajectory portions.

10. The method of claim 9, wherein in case a collision is determined, then a spatial orientation of the machine component is modified in order to avoid the collision.

11. The method of claim 1, further comprising performing the simulation of the first trajectory portion and the second trajectory portion on at least two different CPUs and/or GPUs.

12. The method of claim 1, further comprising performing the simulation of the first trajectory portion and the second trajectory portion on different processor cores.

13. The method of claim 1, wherein the machine component is a milling head comprising a milling tool.

14. The method of claim 1, further comprising measuring, prior to the start of the simulation of the first trajectory portion and the second trajectory portion, dimensions of the work object and/or the machine component.

15. The method of claim 1, further comprising outputting the merged simulation result to an industrial machine, wherein the industrial machine performs work on the work object in accordance with the simulation results.

16. An industrial machine, wherein the industrial machine executes a method for parallelized simulation of the movement of a machine component in or near a work object, the method comprising:
dividing a planned trajectory of the machine component into several time-sequential trajectory portions;
performing a simulation of each first trajectory portion at least partly in parallel regardless of prior movements of the machine component occurring during an earlier trajectory portion, yielding simulation results, wherein the simulation comprises performing a first determination of suspected incidents along the trajectory portions and each said suspected incident is a collision of the machine component with the work object;
merging at least the simulation results of the first trajectory portion and a later in time second trajectory portion yielding a merged simulation result, wherein the merging comprises combining the simulation results of the first trajectory portion and the second trajectory portion, and performing a second determination of suspected incidents including reassessing suspected incidents determined along the later in time second trajectory portion based on the simulation results of the first trajectory portion, wherein the incident is removed from or not taken over into the merged simulation results if the reassessment indicates that the incident cannot occur;

merging a first merged simulation result and a second merged simulation result to create a new merged simulation result, wherein merging comprises combining the first merged simulation result and the second merged simulation result, reassessing incidents stored in the second merged simulation result based on the first merged simulation result, and removing the incident from, or not taking the incident over into the new merged simulation results if the reassessment indicates that the incident cannot occur; and outputting the new merged simulation result.

17. The industrial machine of claim 16, wherein the industrial machine is a milling machine.

\* \* \* \* \*